United States Patent
Chung et al.

(10) Patent No.: US 6,734,106 B2
(45) Date of Patent: May 11, 2004

(54) METHOD OF BURIED STRAP OUT-DIFFUSION FORMATION BY GAS PHASE DOPING

(75) Inventors: Jesse Chung, Chu-Pei (TW); Hsio-Lei Wang, Tainan (TW); Hung-Kwei Liao, Tao-yuan (TW)

(73) Assignee: ProMos Technologies, Inc., Hsin-Chu (TW)

(*) Notice: Subject to any disclaimer, the term of this patent is extended or adjusted under 35 U.S.C. 154(b) by 115 days.

(21) Appl. No.: 10/195,355

(22) Filed: Jul. 15, 2002

(65) Prior Publication Data

US 2003/0064598 A1 Apr. 3, 2003

(30) Foreign Application Priority Data

Oct. 3, 2001 (TW) ........................................ 90124373 A

(51) Int. Cl.[7] .............................................. H01L 21/302
(52) U.S. Cl. ........................ 438/694; 438/696; 438/697; 438/700; 438/719; 438/723; 438/724
(58) Field of Search ................................ 438/694, 696, 438/697, 700, 719, 723, 724

(56) References Cited

U.S. PATENT DOCUMENTS

| | | | |
|---|---|---|---|
| 5,945,704 A | 8/1999 | Schrems et al. ............. 257/301 |
| 6,018,174 A | 1/2000 | Schrems et al. ............. 257/296 |
| 6,150,212 A | * 11/2000 | Divakaruni et al. ......... 438/244 |
| 6,156,606 A | 12/2000 | Michaelis .................... 438/243 |
| 6,184,091 B1 | * 2/2001 | Gruening et al. ............ 438/270 |
| 6,200,873 B1 | 3/2001 | Schrems et al. ............. 438/386 |
| 6,211,020 B1 | 4/2001 | Tripsas et al. .............. 438/294 |
| 6,284,665 B1 | * 9/2001 | Lill et al. .................... 438/710 |
| 6,326,658 B1 | * 12/2001 | Tsunashima et al. ........ 257/301 |
| 6,613,672 B1 | * 9/2003 | Wang et al. ................. 438/689 |
| 6,653,678 B2 | * 11/2003 | Chidambarrao et al. .... 257/301 |

* cited by examiner

*Primary Examiner*—Robert Kunemund
*Assistant Examiner*—Binh X. Tran
(74) *Attorney, Agent, or Firm*—George O. Saile; Stephen B. Ackerman; Stephen G. Stanton

(57) ABSTRACT

A method of forming a buried strap comprising the following sequential steps. A substrate having a pad oxide layer formed thereover is provided. A masking layer is formed over the pad oxide layer. The masking layer, pad oxide layer and substrate are etched to form a trench within the substrate. The trench having an outer sidewall and an upper portion. The upper portion of the trench is lined with a collar. A poly plate is formed within the trench. The poly plate and collar are etched below the substrate to form a recessed poly plate and a recessed collar and exposing a portion of outer sidewall of trench. Ions are implanted into the substrate through exposed outer sidewall of trench by gas phase doping. A SiN sidewall layer is formed over the exposed outer sidewall of trench at a temperature sufficient to diffuse the implanted ions further into the substrate to form the buried strap.

30 Claims, 4 Drawing Sheets

METHOD OF BURIED STRAP OUT-DIFFUSION FORMATION BY GAS PHASE DOPING

FIELD OF THE INVENTION

The present invention relates generally to semiconductor fabrication and more specifically to formation of buried straps.

BACKGROUND OF THE INVENTION

As semiconductor device length shrinks, a shallow junction is desired to satisfy circuit operation. Buried strap out-diffusion serves as a path for the connect trench active area (AA). The current method to form the buried strap out-diffusion is to perform an angle ion implantation into silicon into the buried strap polysilicon (poly) and then to do a drive-in anneal.

U.S. Pat. No. 6,200,873 B1 to Schrems et al. describes a production method for a trench capacitor with an insulation collar and a buried strap process.

U.S. Pat. No. 6,156,606 to Michaelis describes a buried strap process and uses gas phase doping (GPD) for a capacitor doping step.

U.S. Pat. No. 6,018,174 to Schrems et al. describes a buried strap process that uses GPD to dope trench sidewalls.

U.S. Pat. No. 6,211,020 B1 to Tripsas et al. describes a plasma doping process that is used to dope high aspect sidewalls.

U.S. Pat. No. 5,945,704 to Schrems et al. describes a trench capacitor with an epitaxial silicon (EPI) buried layer.

SUMMARY OF THE INVENTION

Accordingly, it is an object of one or more embodiments of the present invention to provide an improved method of forming buried strap out-diffusion areas.

Other objects will appear hereinafter.

It has now been discovered that the above and other objects of the present invention may be accomplished in the following manner. Specifically, a substrate having a pad oxide layer formed thereover is provided. A masking layer is formed over the pad oxide layer. The masking layer, pad oxide layer and substrate are etched to form a trench within the substrate. The trench having an outer sidewall and an upper portion. The upper portion of the trench is lined with a collar. A poly plate is formed within the trench. The poly plate and collar are etched below the substrate to form a recessed poly plate and a recessed collar and exposing a portion of outer sidewall of trench. Ions are implanted into the substrate through exposed outer sidewall of trench by gas phase doping. An SiN sidewall layer is formed over the exposed outer sidewall of trench at a temperature sufficient to diffuse the implanted ions further into the substrate to form the buried strap.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Initial Structure

Figure 1:
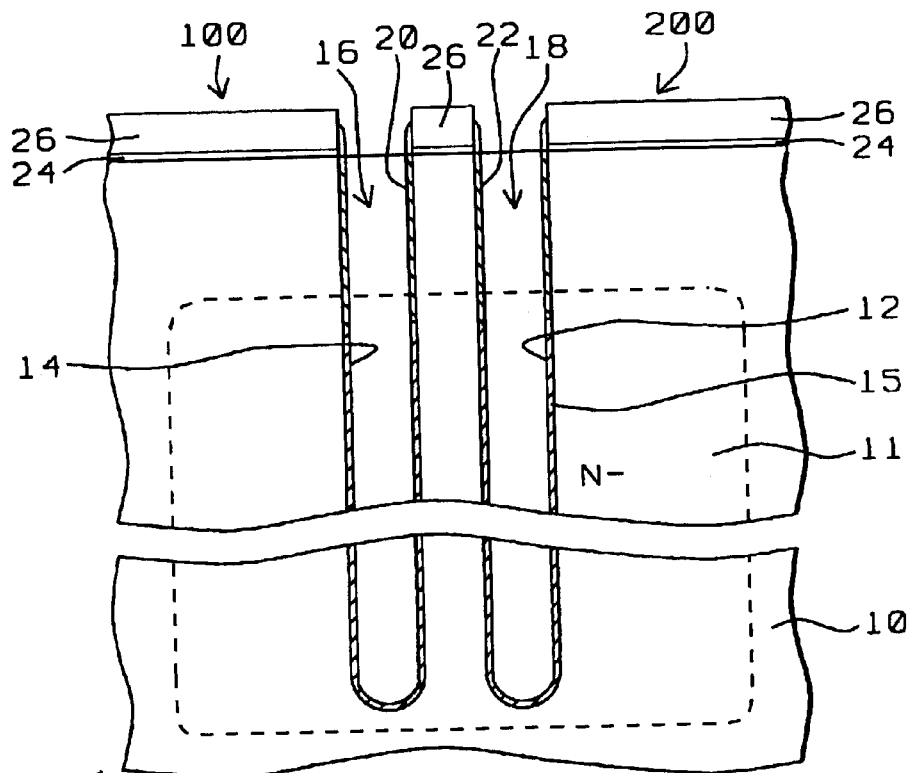
FIGS. 1 to 9 schematically illustrate a preferred embodiment of the present invention.

FIG. 1 illustrates two trench capacitors 100, 200 formed within a substrate 10 that may be used, for example, to form a DRAM memory cell. Substrate 10 is preferably a silicon substrate. Substrate 10 is lightly doped as at buried plate 11 with n-type dopants ($N^-$).

Patterned substrate 10 includes a patterned pad oxide layer 24 formed thereover and a patterned silicon nitride (SiN) masking layer 26 is formed over the pad oxide layer 24. Pad oxide layer 24 is preferably from about 40 to 60 Å thick and is more preferably from about 45 to 55 Å thick. SiN masking layer 26 is preferably from about 1600 to 2200 Å thick and is more preferably from about 1800 to 2000 Å thick.

Each capacitor 200, 100 includes a respective trench 12, 14 etched through the SiN masking layer 26, the pad oxide layer 24 and into substrate 10. As shown in FIG. 1, the upper part of trenches 12, 14 are lined with a respective collar oxide (collar) 20, 22 and then filled with polysilicon/contact polysilicon to form poly plates 16, 18. The poly plates 16, 18 may be lightly doped with n-type dopants ($N^+$) and preferably arsenic ($As^+$). $N^-$ buried plate 11 and the $As^+$ poly plates 16, 18 serve as plates while the node dielectric 15 serve as the capacitor dielectric for the respective capacitors 100, 200.

Collars 20, 22 are each preferably from about 20 to 60 Å thick and more preferably from about 25 to 40 Å thick.
Recession of Poly Plates 16, 18/Collars 20, 22

Figure 2:
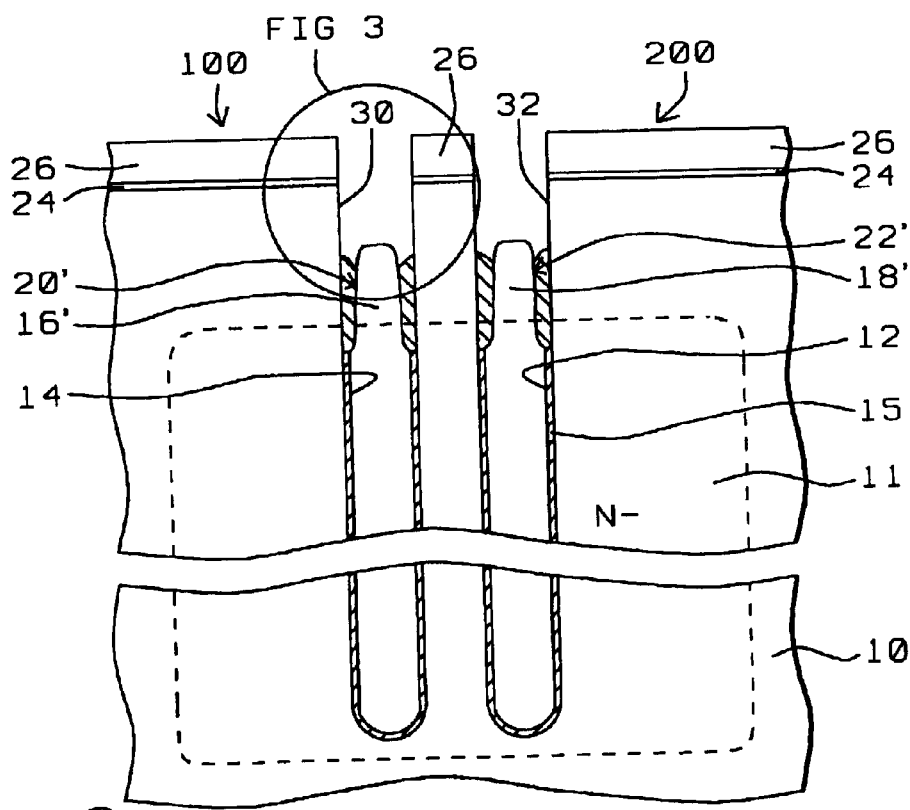

As shown in FIG. 2, poly plates 16, 18 and collars 20, 22 are etched to form recessed poly plates 16' 18' and recesses collars 20', 22' to permit access to the sidewalls 30, 32 of the substrate 10. Poly plates 16, 18 are preferably recessed from about 80 to 150 Å, and more preferably from about 100 to 140 Å below the upper surface of the substrate 10 to expose preferably from about 90 to 150 Å and more preferably from about 100 to 135 Å of sidewalls 30, 32. The collars 20, 22 are preferably etched using a wet process such as a DHF wet process or a BHF wet process.

Formation of the buried straps 50 into the now exposed substrate sidewalls 30, 32 may now commence. For clarity, only the portion of FIG. 2 within the circle marked "FIG. 3" will be enlarged and shown in the subsequent steps. It is noted that the corresponding trench capacitor 200 is processed according to the following description of the processing of trench capacitor 100.
Gas Phase Doping 34

Figure 3:
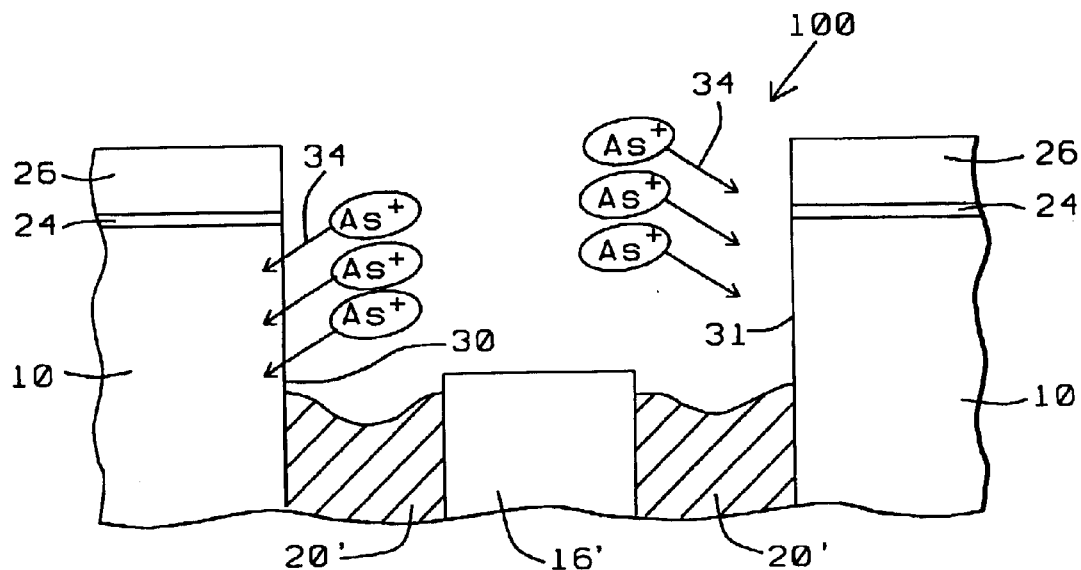

As shown in FIG. 3 (an enlarged portion of FIG. 2 within the circle labeled "FIG. 3" highlighting the upper portion trench capacitor 100) the exposed sidewall 30 is subjected to gas phase doping (GPD) 34 implanting preferably $As^+$ ions into the sidewall 30 to a surface concentration of preferably from about 1E18 to 1E20 atoms/cm$^3$ and more preferably from about 1E19 to 1E20 atoms/cm$^3$. The SiN mask 26 protects the upper surface of the patterned substrate 10 during the GPD 34.

It is noted that $As^+$ ions are also implanted into the sidewall 31 of the portion of the patterned substrate 10 separating trench capacitors 100, 200. $As^+$ ions are also implanted into $As^+$ doped poly plates 16, 18 but generally at a dosage less than that of the initially doped poly plates 16, 18.

The GPD 34 is conducted at the following additional conditions:

pressure: preferably from about 150 to 380 torr;
temperature: preferably from about 900 to 1000° C.;

resistivity: preferably from about 2000 to 50 ohm/sq.;

time: for preferably from about 120 to 200 minutes;

$AsH_3$: for preferably from about 200 sccm to 1000 sccm; and dopant gas pressure: of preferably from about 100 torr to 400 torr.

The relatively high temperature of from about 900 to 1000° C. causes the $As^+$ ions to diffuse into the silicon lattice of the substrate 10 adjacent sidewall 30.

Formation of Thin SiN Sidewall Layer 36 over Substrate 10 Exposed Sidewall 30

Then, a thin silicon nitride (SiN) sidewall layer 36 is formed over the exposed sidewall 30 of substrate 10 under the following conditions:

temperature: preferably from about 650 to 750° C. and more preferably about 700° C.;

gases: ammonia ($NH_3$) and nitrogen ($N_2$); and for preferably from about 10 to 20 minutes.

SiN sidewall layer 36 has a thickness of preferably from about 3 to 8 Å and more preferably from about 4 to 6 Å.

Figure 4:
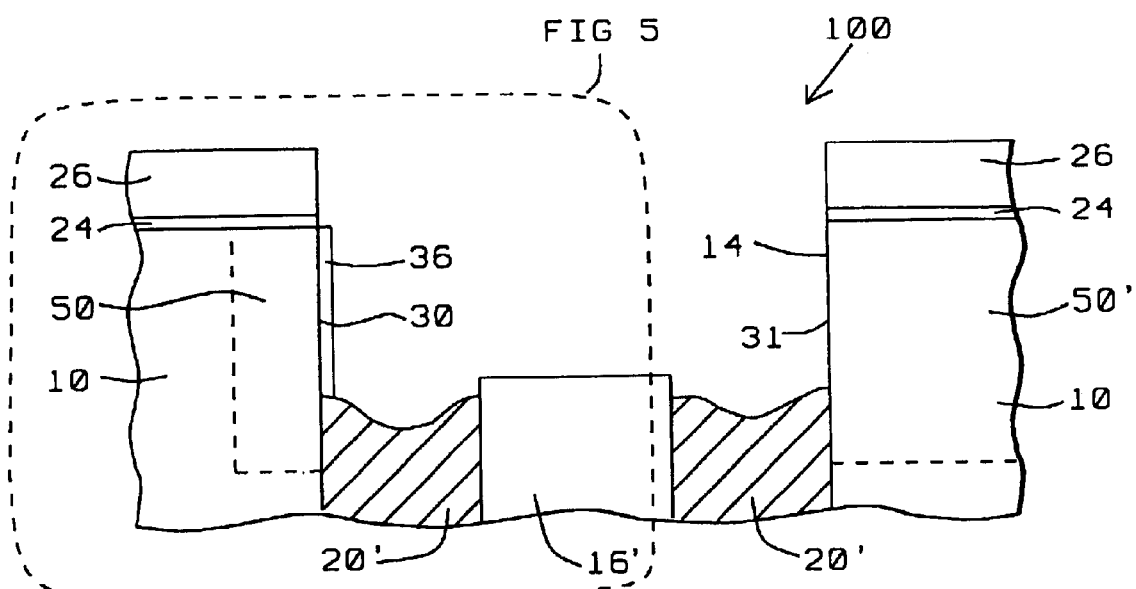

The temperature used to form thin SiN sidewall layer 36 further diffuses the $As^+$ ions into the Si lattice and finalizes formation of buried strap 50 (and buried strap 50' into the portion of the patterned substrate 10 separating trench capacitors 100, 200 as shown in FIG. 4).

Strap 50 extends preferably from about 500 to 1500 Å into substrate 10 from sidewall 30 and more preferably from about 800 to 1200 Å and has a resistivity of preferably from about 2000 to 50 ohm/square.

Thin SiN sidewall layer 36 functions to provide a thin SiN interface against the sidewall 30 to block, or relieve, stress.

Deposition of Buried Strap Polysilicon Layer 40

Figure 5:
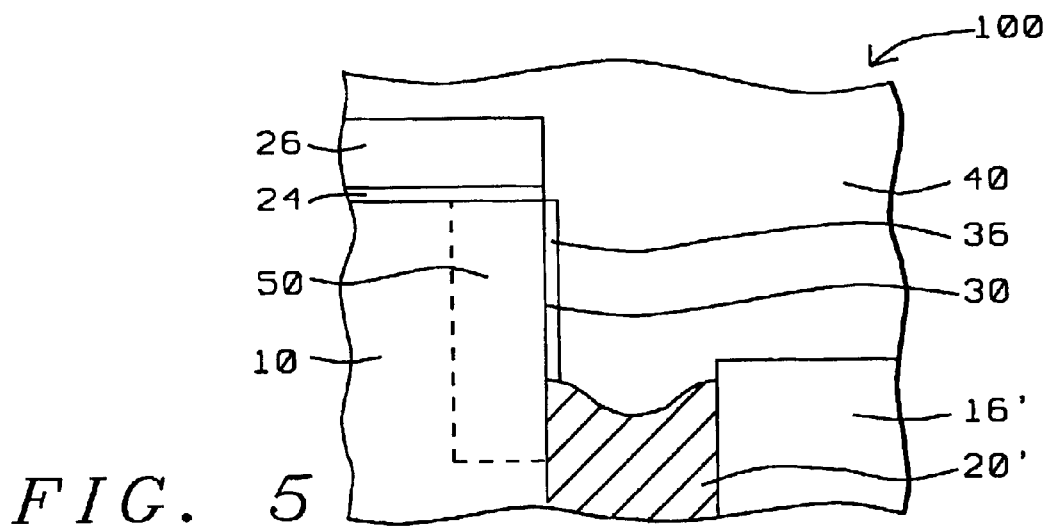

As shown in FIG. 5, a buried strap polysilicon layer 40 is formed over the structure to a thickness of preferably from about 2500 to 3500 Å over SiN masking layer 26 and more preferably from about 2800 to 3200 Å.

FIGS. 5 through 8 represent a portion of FIG. 4 as illustrated.

Planarization 42 of Buried Strap Polysilicon Layer 40

Figure 6:
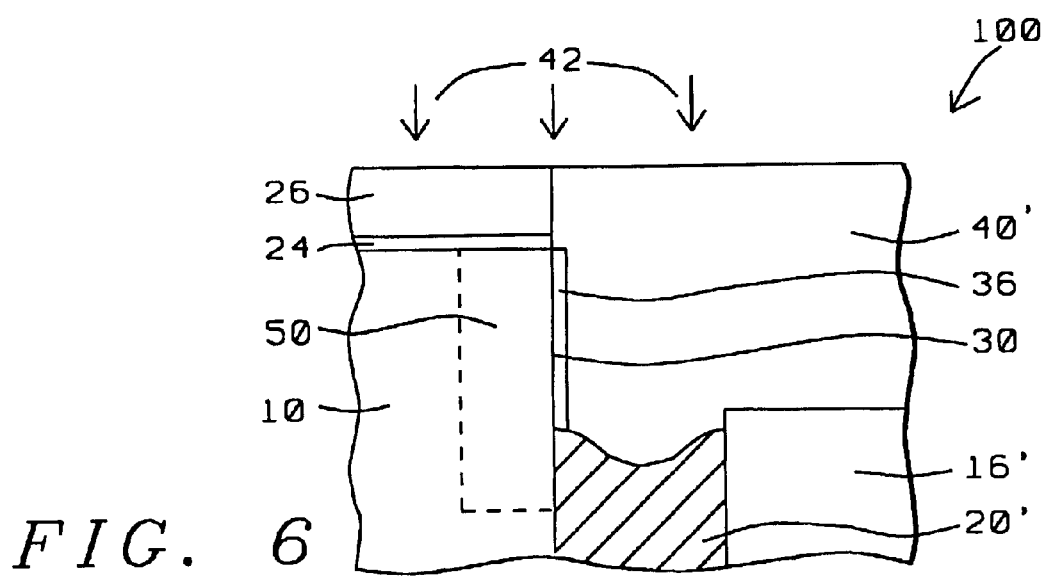

As shown in FIG. 6, the buried strap polysilicon layer 40 is planarized, preferably by chemical mechanical polishing (CMP) 42, using SiN masking layer 26 as a polish stop, to form planarized buried strap polysilicon layer 40'.

Recess Etch 44 of Planarized Buried Strap Polysilicon Layer 40'

Figure 7:
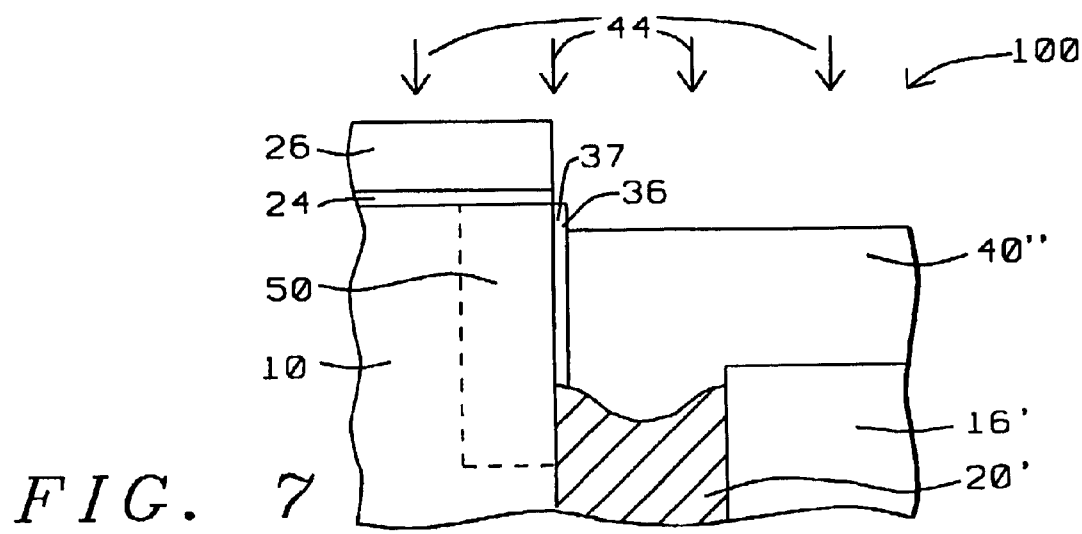

As shown in FIG. 7, a recess etch 44 is performed to recess planarized buried strap polysilicon layer 40' to form a recessed buried strap polysilicon layer 40" that exposes a portion 37 of thin SiN sidewall layer 36. Patterned SiN masking layer 26 protects patterned silicon substrate 10 from recess etch 44.

Removal of SiN Masking Layer 26 and Pad Oxide Layer 24

Figure 8:
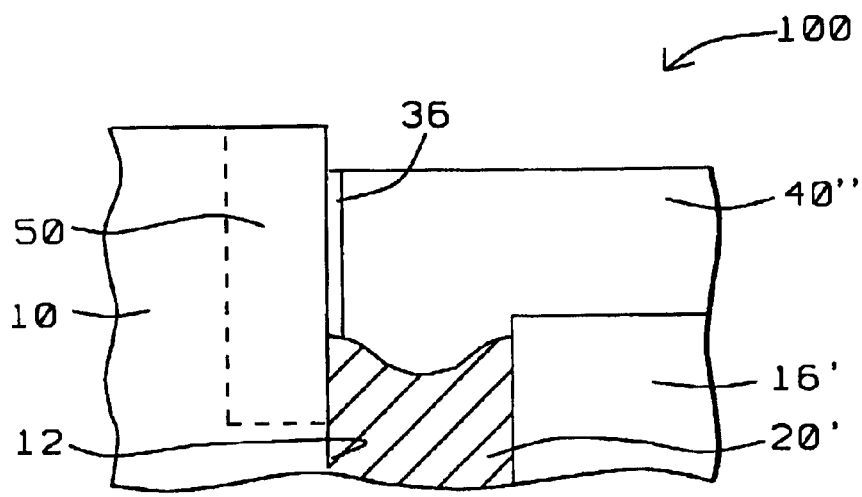

As shown in FIG. 8, SiN masking layer 26 and pad oxide layer 24 are removed with the exposed portion 37 of thin SiN sidewall layer 36.

This completes formation of buried straps 50.

Further Processing

Figure 9:
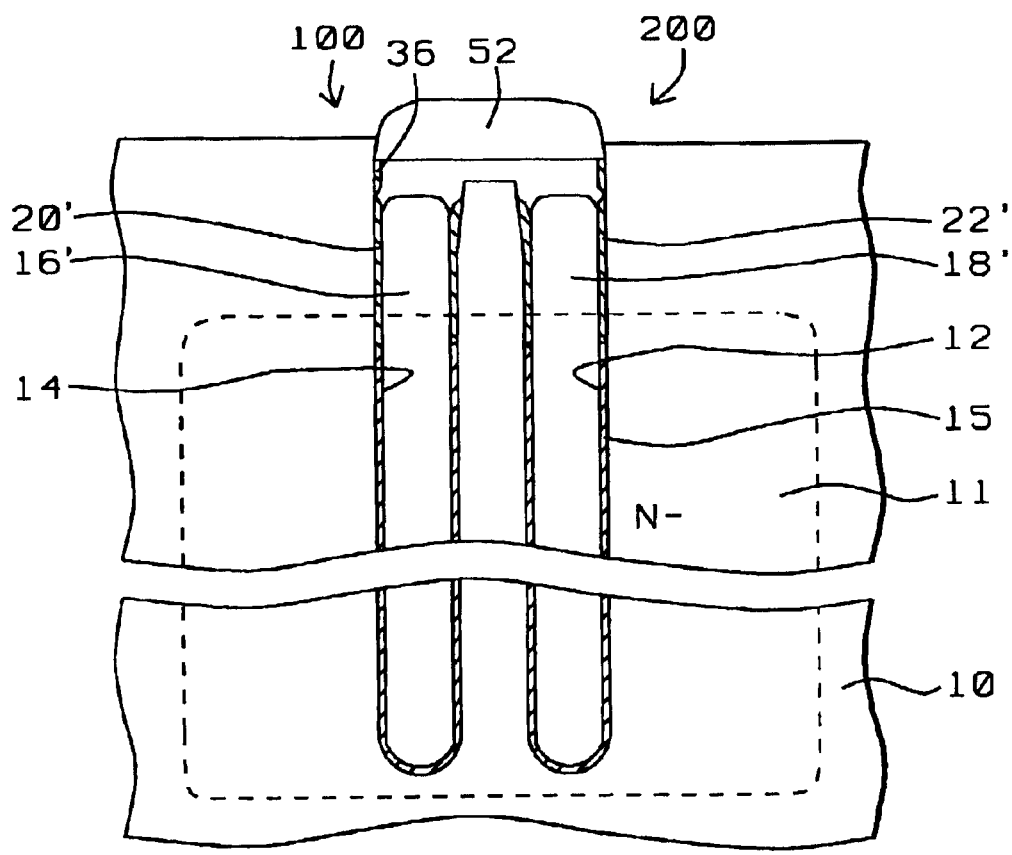

As shown in FIG. 9, further processing may then proceed. For example, a shallow trench isolation (STI) structure 52 may be formed over trench capacitors 100, 200 as shown.

Advantages of the Present Invention

The advantages of one or more embodiments of the present invention include:

1. integrate buried strap (BS) diffusion and SiN interface;
2. no implanting damage;
3. adjustable surface concentration and diffuse length;
4. better diffusion uniformity (special for trench component); and
5. commercial tools may be used, for example those manufactured by IBM, Infineon and Toshiba Alliance.

While particular embodiments of the present invention have been illustrated and described, it is not intended to limit the invention, except as defined by the following claims.

We claim:

1. A method of forming a buried strap, comprising the sequential steps of:

providing a substrate having a pad oxide layer formed thereover;

forming a masking layer over the pad oxide layer;

etching the masking layer, pad oxide layer and substrate to form a trench within the substrate; the trench having an outer sidewall and an upper portion;

lining the upper portion of the trench with a collar;

forming a poly plate within the trench;

etching the poly plate and collar below the substrate to form a recessed poly plate and a recessed collar and exposing a portion of outer sidewall of trench;

implanting ions into the substrate through exposed outer sidewall of trench by gas phase doping; and forming a SiN sidewall layer over the exposed outer sidewall of trench at a temperature sufficient to diffuse the implanted ions further into the substrate to form the buried strap.

2. The method of claim 1, further including the steps of:

forming a planarized buried strap polysilicon layer over the structure after formation of the buried strap;

etching the planarized buried strap polysilicon layer to form a recessed buried strap polysilicon layer exposing an upper portion of the SiN sidewall layer; and removing the etched masking layer and the etched pad oxide layer from over the substrate, and the exposed upper portion of the SiN sidewall layer.

3. The method of claim 1, wherein the collar is from about 20 to 60 Å thick.

4. The method of claim 1, wherein the recessed poly plate is recessed from about 80 to 150 Å below the substrate.

5. The method of claim 1, wherein the ions are implanted into the substrate through the exposed outer sidewall of trench to a surface concentration of from about 1E18 to 1E20 atoms/$cm^3$.

6. The method of claim 1, wherein the implantation of the ions by gas phase doping is conducted at a pressure of from about 150 to 380 torr, a temperature of from about 900 to 1000° C., a time of from about 120 to 200 minutes, an $AsH_3$ gas flow of from about 200 to 1000 sccm; and a dopant gas pressure of from about 100 to 400 torr.

7. The method of claim 1, wherein the buried strap extends from about 500 to 1500 Å into the substrate.

8. The method of claim 1, wherein the SiN sidewall layer is formed to a thickness of from about 3 to 8 Å.

9. The method of claim 1, wherein the SiN sidewall layer is formed using ammonia and nitrogen at a temperature of from about 650 to 750° C. for a time of from about 10 to 20 minutes.

10. The method of claim 1, wherein the planarized buried strap polysilicon layer is planarized using a chemical mechanical polishing process.

11. The method of claim 1, wherein the ions are $As^+$ ions.

12. A method of forming a buried strap, comprising the sequential steps of:

providing a substrate having a pad oxide layer formed thereover;

forming a masking layer over the pad oxide layer;

etching the masking layer, pad oxide layer and substrate to form a trench within the substrate; the trench having an outer sidewall and an upper portion;

lining the upper portion of the trench with a collar;

forming a poly plate within the trench;

etching the poly plate and collar below the substrate to form a recessed poly plate and a recessed collar and exposing a portion of outer sidewall of trench;

implanting $As^+$ ions into the substrate through exposed outer sidewall of trench by gas phase doping to a surface concentration of from about 1E18 to 1E20 atoms/cm$^3$; and forming a SiN sidewall layer over the exposed outer sidewall of trench at a temperature sufficient to diffuse the implanted $As^+$ ions further into the substrate to form the buried strap having a resistivity of from about 2000 to 50 ohm/square.

13. The method of claim 12, further including the steps of:

forming a planarized buried strap polysilicon layer over the structure after formation of the buried strap;

etching the planarized buried strap polysilicon layer to form a recessed buried strap polysilicon layer exposing an upper portion of the SiN sidewall layer; and removing the etched masking layer and the etched pad oxide layer from over the substrate, and the exposed upper portion of the SiN sidewall layer.

14. The method of claim 12, wherein the collar is from about 20 to 60 Å thick.

15. The method of claim 12, wherein the recessed poly plate is recessed from about 80 to 150 Å below the substrate.

16. The method of claim 12, wherein the implantation of $As^+$ ions by gas phase doping is conducted at a pressure of from about 150 to 380 torr, a temperature of from about 900 to 1000° C., a time of from about 120 to 200 minutes, an AsH$_3$ gas flow of from about 200 to 1000sccm; and a dopant gas pressure of from about 100 to 400 torr.

17. The method of claim 12, wherein the buried strap extends from about 500 to 1500 Å into the substrate.

18. The method of claim 12, wherein the SiN sidewall layer is formed to a thickness of from about 3 to 8 Å.

19. The method of claim 12, wherein the SiN sidewall layer is formed using ammonia and nitrogen at a temperature of from about 650 to 750° C. for a time of from about 10 to 20 minutes.

20. The method of claim 12, wherein the planarized buried strap polysilicon layer is planarized using a chemical mechanical polishing process.

21. A method of forming a buried strap, comprising the sequential steps of:

providing a substrate having a pad oxide layer formed thereover;

forming a masking layer over the pad oxide layer;

etching the masking layer, pad oxide layer and substrate to form a trench within the substrate; the trench having an outer sidewall and an upper portion;

lining the upper portion of the trench with a collar;

forming a poly plate within the trench;

etching the poly plate and collar below the substrate to form a recessed poly plate and a recessed collar and exposing a portion of outer sidewall of trench;

implanting $As^+$ ions into the substrate through exposed outer sidewall of trench by gas phase doping;

forming a SiN sidewall layer over the exposed outer sidewall of trench at a temperature sufficient to diffuse the implanted As+ ions further into the substrate to form the buried strap;

forming a planarized buried strap polysilicon layer over the structure;

etching the planarized buried strap polysilicon layer to form a recessed buried strap polysilicon layer exposing an upper portion of SiN sidewall layer; and removing the etched masking layer and the etched pad oxide layer from over the substrate.

22. The method of claim 21, wherein the pad oxide layer has a thickness of from about 40 to 60 Å; and the masking layer has a thickness of from about 1600 to 2200 Å.

23. The method of claim 21, wherein the collar is from about 20 to 60 Å thick.

24. The method of claim 21, wherein the recessed poly plate is recessed from about 80 to 150 Å below the substrate.

25. The method of claim 21, wherein the $As^+$ ions are implanted into the substrate through the exposed outer sidewall of trench to a surface concentration of from about 1E18 to 1E20 atoms/cm$^3$.

26. The method of claim 21, wherein the implantation of $As^+$ ions by gas phase doping is conducted at a pressure of from about 150 to 380 torr, a temperature of from about 900 to 1000° C., a time of from about 120 to 200 minutes, an AsH$_3$ gas flow of from about 200 to 1000 sccm; and a dopant gas pressure of from about 100 to 400 torr.

27. The method of claim 21, wherein the buried strap extends from about 500 to 1500 Å into the substrate.

28. The method of claim 21, wherein the SiN sidewall layer is formed to a thickness of from about 3 to 8 Å.

29. The method of claim 21, wherein the SiN sidewall layer is formed using ammonia and nitrogen at a temperature of from about 650 to 750° C. for a time of from about 10 to 20 minutes.

30. The method of claim 21, wherein the planarized buried strap polysilicon layer is planarized using a chemical mechanical polishing process.

\* \* \* \* \*

UNITED STATES PATENT AND TRADEMARK OFFICE
CERTIFICATE OF CORRECTION

PATENT NO. : 6,734,106 B2  
DATED : May 11, 2004  
INVENTOR(S) : Jesse Chung, Hsiao-Lei Wang and Hung-Kwei Liao Page 1 of 1

It is certified that error appears in the above-identified patent and that said Letters Patent is hereby corrected as shown below:

<u>Title page,</u>
Item [75], Inventors, delete "Hsio-Lei Wang, Tainan (TW)" and replace with
-- Hsiao-Lei Wang, Tainan (TW) --.

Signed and Sealed this

Thirtieth Day of November, 2004

JON W. DUDAS  
*Director of the United States Patent and Trademark Office*